US008085082B2

(12) United States Patent  (10) Patent No.: US 8,085,082 B2
Penzes  (45) Date of Patent: Dec. 27, 2011

(54) HIGH SPEED MULTIPLEXER

(75) Inventor: Paul Penzes, Newport Beach, CA (US)

(73) Assignee: Broadcom Corporation, Irvine, CA (US)

(*) Notice: Subject to any disclaimer, the term of this patent is extended or adjusted under 35 U.S.C. 154(b) by 86 days.

(21) Appl. No.: 11/807,973

(22) Filed: May 30, 2007

(65) Prior Publication Data

US 2008/0301412 A1    Dec. 4, 2008

(51) Int. Cl.
*H03K 17/00* (2006.01)
(52) U.S. Cl. ......................................... 327/407
(58) Field of Classification Search .............. 327/99, 327/407–413
See application file for complete search history.

(56) References Cited

U.S. PATENT DOCUMENTS

| | | | | |
|---|---|---|---|---|
| 4,820,992 A * | 4/1989 | Avis | ................ | 327/298 |
| 5,646,558 A * | 7/1997 | Jamshidi | ................ | 326/106 |
| 5,796,288 A * | 8/1998 | Krech et al. | ................ | 327/407 |
| 6,542,013 B1 * | 4/2003 | Volk et al. | ................ | 327/115 |
| 6,829,321 B1 * | 12/2004 | Ikeno | ................ | 377/64 |
| 6,995,600 B2 * | 2/2006 | Rogenmoser et al. | ........ | 327/410 |
| 7,417,482 B2 * | 8/2008 | Elgebaly et al. | .............. | 327/278 |
| 7,439,774 B2 * | 10/2008 | Jung | ................ | 326/113 |
| 2005/0024956 A1 * | 2/2005 | Tran et al. | ................ | 365/200 |
| 2005/0256996 A1 * | 11/2005 | Watanabe | ................ | 711/5 |
| 2007/0260856 A1 * | 11/2007 | Tran et al. | ................ | 712/217 |

* cited by examiner

*Primary Examiner* — Lincoln Donovan
*Assistant Examiner* — Sibin Chen
(74) *Attorney, Agent, or Firm* — Farjami & Farjami LLP

(57) ABSTRACT

According to one embodiment, a high speed multiplexer includes a number of data inputs, a number of hot code select inputs, and a final data output. In one embodiment, the high speed multiplexer utilizes a number of intermediate multiplexers, each receiving respective hot code select inputs and providing an intermediate data output. In one embodiment, each intermediate multiplexer has a critical delay path comprising a first NAND gate and a second NAND gate. In one implementation a four-to-one intermediate multiplexer comprises a first two-input NAND gate and a second four-input NAND gate. In one embodiment, a 32-to-1 high speed multiplexer comprises four four-to-one intermediate multiplexers. According to one implementation of this embodiment, the 32-to-1 multiplexer has a critical delay path from any of the data inputs to the final data output comprising a first NAND gate, a second NAND gate, a NOR gate, and a third NAND gate.

19 Claims, 5 Drawing Sheets

US 8,085,082 B2

HIGH SPEED MULTIPLEXER

BACKGROUND OF THE INVENTION

1. Field of the Invention

The present invention is generally in the field of electronics. More particularly, the present invention is in the field of electronic circuit and logic design.

2. Background

The data propagation delay in conventional multiplexers can significantly delay the transmission of data in electronic circuits, thereby undesirably causing the circuits to operate slowly or even causing the circuits to malfunction. Furthermore, the data propagation delay can be substantially higher in larger multiplexers, such as 32-to-1 multiplexers, than in smaller multiplexers, such as two-to-one multiplexers. Thus, conventional multiplexers are unsuitable for many high speed circuit applications, such as a Scoreboard unit in a complex CPU, which typically require the use of large high speed multiplexers.

For example, one conventional multiplexer includes a configuration of complementary metal-oxide-semiconductor ("CMOS") transmission gates arranged in a "tree structure." However, such an implementation is impractical in large multiplexers (i.e., multiplexers having a large number of inputs), since it can disadvantageously result in the formation of long chains of series coupled CMOS transmission gates. In a 32-to-1 multiplexer, for example, as many as five CMOS transmission gates coupled in series can be required. These long chains of CMOS transmission gates can undesirably cause large propagation delays in the multiplexer and can substantially increase the noise sensitivity of the multiplexer.

Another conventional multiplexer includes at least one "wide" input logic gate, such as an eight-input OR gate. However, such an implementation is also impractical since wide input logic gates typically operate very slowly, and can therefore cause large propagation delays in the multiplexer.

Yet another conventional multiplexer includes low threshold voltage ("low $V_T$") devices, such as low $V_T$ logic gates, which can operate faster than conventional logic gates. However, the use of low $V_T$ devices is impractical in many applications due to their high cost. As such, the conventional multiplexers described above fail to provide a low cost, high speed multiplexer that is suitable for high speed circuit applications.

SUMMARY OF THE INVENTION

A high speed multiplexer, substantially as shown in and/or described in connection with at least one of the figures, as set forth more completely in the claims.

DETAILED DESCRIPTION OF THE INVENTION

The present invention is directed to a high speed multiplexer. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
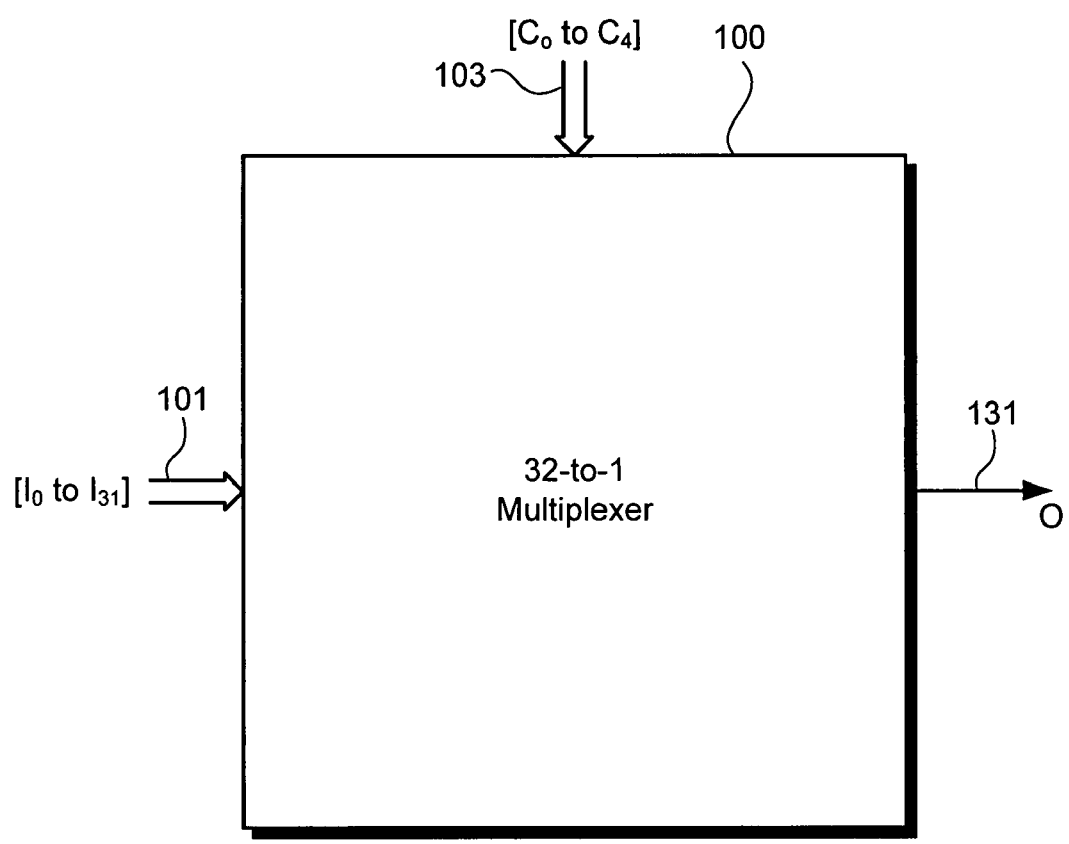
FIG. 1 shows a block diagram of a high speed multiplexer in accordance with one embodiment of the invention.

FIG. 1 shows a block diagram of a high speed multiplexer in accordance with one embodiment of the invention. As shown in FIG. 1, multiplexer 100 is a 32-to-1 multiplexer having data inputs 101, select inputs 103, and final data output ("O") 131. Data inputs 101 includes 32 data inputs $I_0$ through $I_{31}$, while select inputs 103 includes five select inputs $C_0$ through $C_4$. Multiplexer 100 is configured to output the data provided by a particular data input by using select inputs 103 to select the particular data input. In the embodiment shown in FIG. 1, each data input of multiplexer 100 can be associated with one of 32 possible combinations of logic values that can be provided by select inputs $C_0$ through $C_4$. For example, a first data input, referred to as data input $I_0$, can be selected by inputting a logic "0" to each of select inputs $C_0$ through $C_4$, while data input $I_{31}$ can selected by inputting a logic "1" to each of select inputs $C_0$ through $C_4$. The data provided to the selected data input can be output at final data output 131.

By way of background, there are several multiplexer implementations which are known in the art. For example, one conventional implementation includes a configuration of complementary metal-oxide-semiconductor ("CMOS") transmission gates arranged in a tree structure. However, such an implementation is impractical in large multiplexers (i.e., multiplexers having a large number of inputs), since it can disadvantageously result in the formation of long chains of series coupled CMOS transmission gates. In a 32-to-1 multiplexer, for example, as many as five CMOS transmission gates coupled in series can be required. These long chains of CMOS transmission gates can undesirably cause large propagation delays in the multiplexer and can substantially increase the noise sensitivity of the multiplexer. Another conventional implementation of a multiplexer includes the use of at least one "wide" input logic gate, such as an eight-input OR gate. However, such an implementation is also impractical since wide input logic gates operate very slowly and can cause large propagation delays in the multiplexer.

Figure 2:
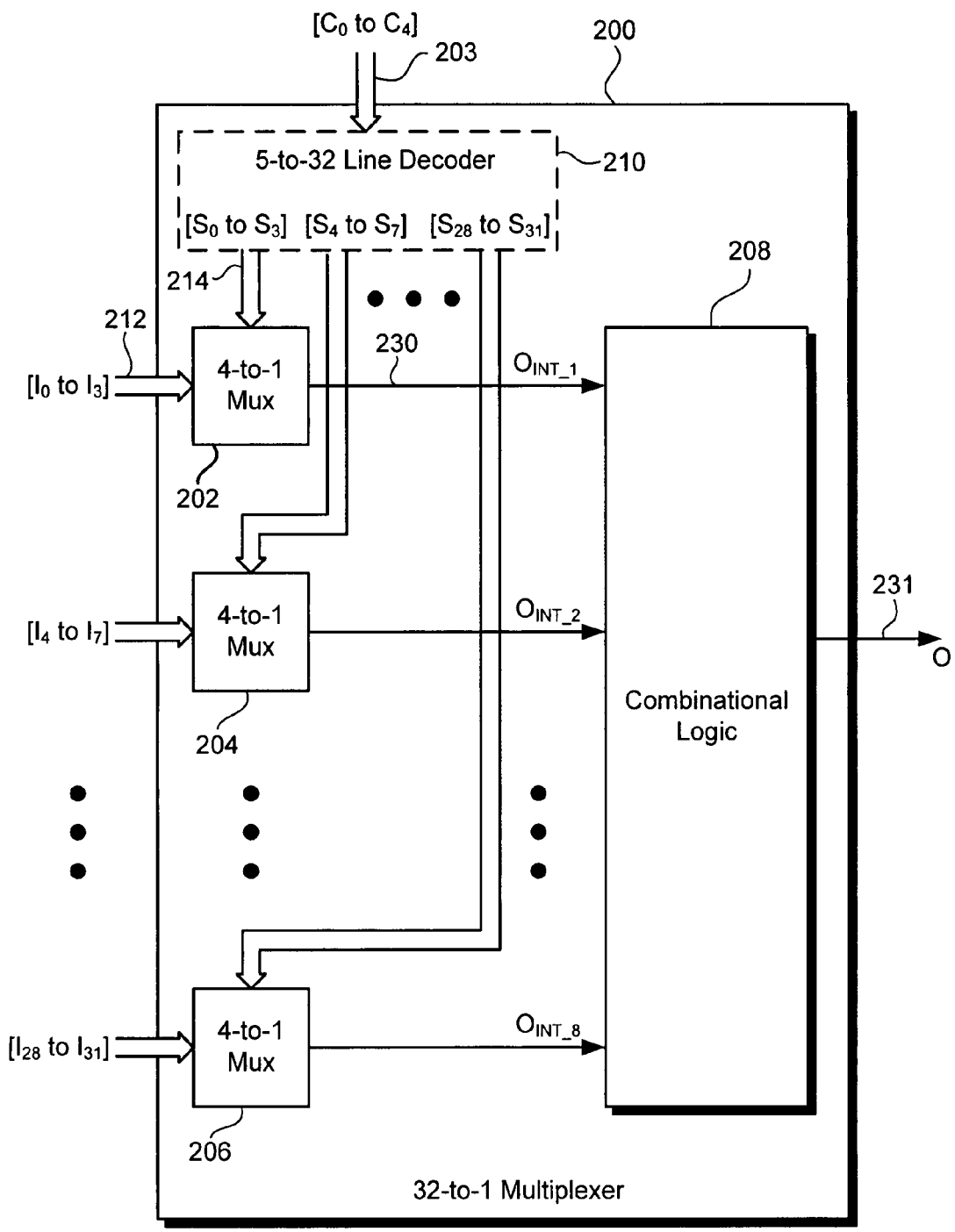
FIG. 2 shows a block diagram of a 32-to-1 multiplexer in accordance with one embodiment of the invention.

FIG. 2 shows a block diagram of an implementation of the 32-to-1 multiplexer 100 of FIG. 1 in accordance with one embodiment of the invention. As shown in FIG. 2, multiplexer 200 includes intermediate multiplexers 202, 204, and 206, combinational logic 208, and decoder 210. In the embodiment shown in FIG. 2, multiplexer 200 includes eight intermediate multiplexers, of which only the three intermediate multiplexers 202, 204, and 206, are shown for ease of illustration. Intermediate multiplexers 202 and 204 in FIG. 2 represent the first and second intermediate multiplexers in multiplexer 200, respectively, while intermediate multiplexer 206 represents the eighth intermediate multiplexer.

As shown in FIG. 2, each of the eight intermediate multiplexers in multiplexer 200 is a four-to-one multiplexer having four data inputs, four "hot code" select inputs, and an intermediate data output. As known in the art, in a "hot code" scheme, only one bit is valid at any given time, while all other bits are zero. Intermediate multiplexer 202 has data inputs 212, which includes four data inputs $I_0$ through $I_3$. Thus, as shown in FIG. 2, the eight intermediate multiplexers in multiplexer 200 receive the 32 data inputs, i.e., data inputs $I_0$ through $I_{31}$, which correspond to the 32 data inputs 101 of multiplexer 100 in FIG. 1.

As mentioned above, each of the eight intermediate multiplexers in multiplexer 200 has four hot code select inputs. For example, intermediate multiplexer 202 has hot code select inputs 214, which includes four hot code select inputs $S_0$ through $S_3$. Thus, as shown in FIG. 2, the eight intermediate multiplexers in multiplexer 200 provide a total of 32 hot code select inputs, i.e., hot code select inputs $S_0$ through $S_{31}$. As stated above, only one of the 32 hot code select inputs can be valid at a given time. In the embodiment shown in FIG. 2, hot code select inputs $S_0$ through $S_{31}$ of multiplexer 200 are respectively associated with data inputs $I_0$ through $I_{31}$ of multiplexer 200. For example, hot code select input $S_0$ is associated with data input $I_0$, hot code select input $S_1$ is associated with data input $I_1$, and so on. Accordingly, a desired data input of an intermediate multiplexer can be selected when the hot code select input associated with the desired data input is at logic "1" (while all other hot code select inputs are at logic "0"). The data present at the selected data input of an intermediate multiplexer can then be output at the data output of the intermediate multiplexer. For example, intermediate multiplexer 202 in FIG. 2 can output data at intermediate data output ("$O_{INT\_1}$") 230.

In the embodiment shown in FIG. 2, decoder 210 is a 5-to-32 decoder configured to receive select inputs 203, i.e. select inputs $C_0$ through $C_4$ corresponding to select inputs 103 in FIG. 1, and to generate hot code select inputs $S_0$ through $S_{31}$, such that only one of select inputs $S_0$ through $S_{31}$ is valid at a given time. In other embodiments, hot code select inputs $S_0$ through $S_{31}$ can be generated externally and provided to multiplexer 200 without using decoder 210.

Figure 3:
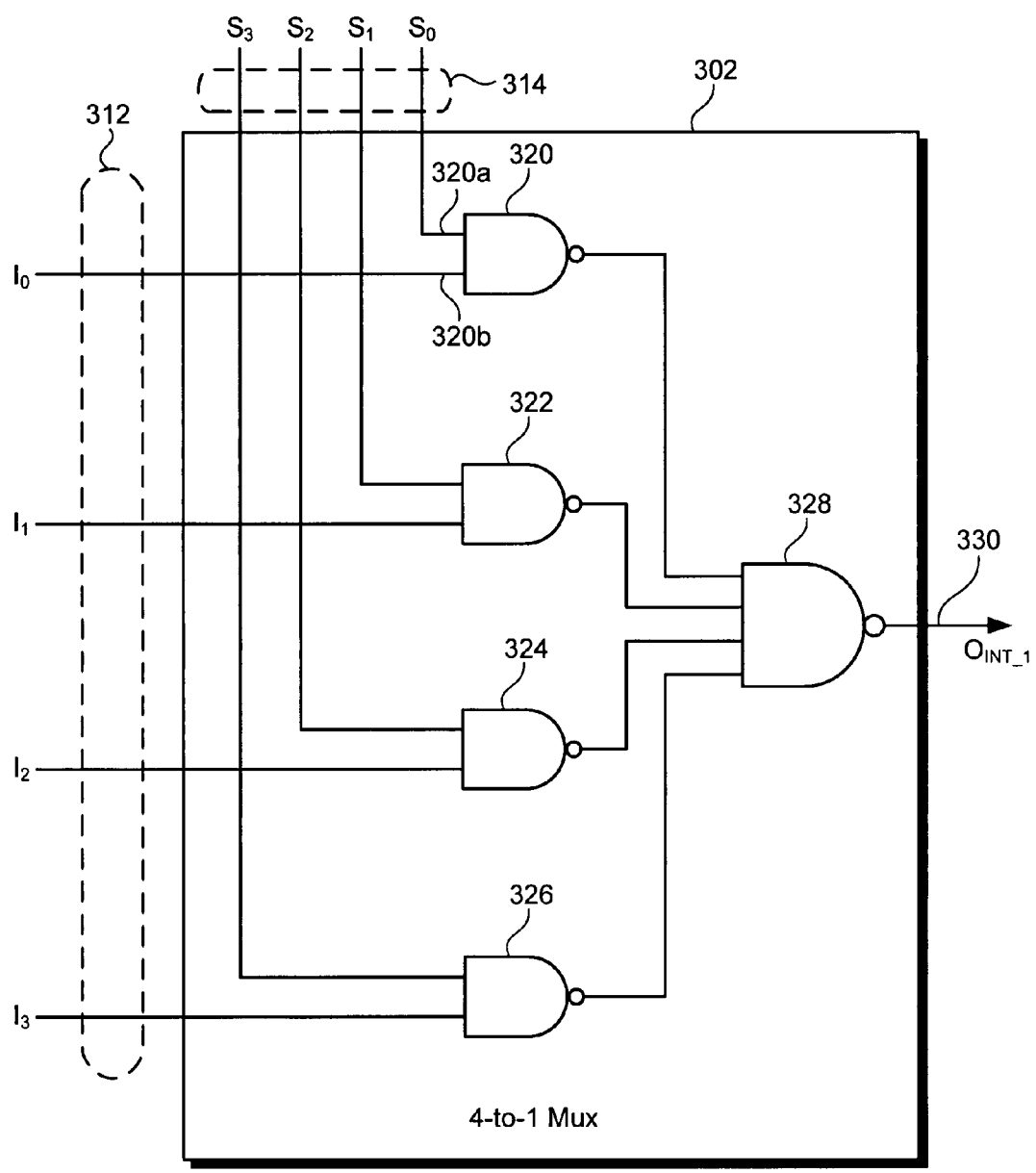
FIG. 3 shows an exemplary implementation of an intermediate multiplexer used in the block diagram of FIG. 2, in accordance with one embodiment of the invention.

An exemplary implementation of an intermediate multiplexer, such as intermediate multiplexer 202, is now discussed with reference to FIG. 3. FIG. 3 shows intermediate multiplexer 302, which is a four-to-one multiplexer. As shown in FIG. 3, intermediate multiplexer 302 includes NAND gates 320, 322, 324, and 326, which are all two-input NAND gates, and NAND gate 328, which is a four-input NAND gate. As shown in FIG. 3, intermediate multiplexer 302 has data inputs 312, hot code select inputs 314, and intermediate data output ("$O_{INT\_1}$") 330. As also shown in FIG. 3, data inputs 312 includes four data inputs $I_0$ through $I_3$, while hot code select inputs 314 includes four hot code select inputs $S_0$ through $S_3$. Data inputs 312, hot code select inputs 314, and intermediate data output 330 in FIG. 3 correspond to data inputs 212, hot code select inputs 214, and intermediate data output 230 in FIG. 2, respectively.

As shown in FIG. 3, a first input of each NAND gate in intermediate multiplexer 302 is configured to receive a hot code select input, while a second input of each NAND gate is configured to receive a data input associated with the hot code select input. For example, NAND gate 320 is configured to receive hot code select input $S_0$ at input 320a and to receive data input $I_0$ at input 320b. As also shown in FIG. 3, the outputs of NAND gates 320, 322, 324, and 326 are provided as inputs to NAND gate 328, which in turn generates intermediate data output 330.

Intermediate multiplexer 302 can thus output, at intermediate data output 330, the data present at one of data inputs $I_0$ through $I_3$, based on hot code select inputs $S_0$ through $S_3$. For example, to select data input $I_1$, hot code select input $S_1$ need be a logic "1," while hot code select inputs $S_0$, $S_2$, and $S_3$ would be a logic "0." As a result, NAND gate 322 would output the inverse of the data provided to data input $I_1$ and NAND gates 320, 324, and 326 would each output a logic "1." The NAND operation performed by NAND gate 328 can then determine the inverse of the output provided by NAND gate 322 to output the data as originally provided to data input $I_1$. It is noted that intermediate multiplexer 302 can output data at a substantially higher speed than a conventional four-to-one multiplexer. More specifically, since the critical delay path from any of data inputs 312 to intermediate data output 330 includes two consecutive NAND gates, e.g., NAND gates 320 and 328, the critical delay path of intermediate multiplexer 302 advantageously reduces the data propagation delay in intermediate multiplexer 302. In contrast, conventional four-to-one multiplexers are typically implemented using NOR gates, which undesirably increase the data propagation delay in the multiplexers.

An important point of distinction about the intermediate multiplexers used in the present invention, e.g. intermediate multiplexer 302 illustrated in FIG. 3, is that when all hot code select input $S_1$ through $S_3$ are at logic "0," intermediate data output 330 will be forced to logic "0." This characteristic is not true with conventional four-to-one multiplexers, since even when all select inputs are at logic "0," the output will correspond to whatever input value exists at data input $I_0$ (which could be a logic "1" or "0"). The fact that intermediate data output 330 is forced to logic "0" will make possible implementation of combinational logic 208 as an equivalent of an OR gate (instead of, for example, another multiplexer—which would be more complex and it requires its own select lines), as illustrated and discussed in more detail in relation to FIG. 5.

Figure 4A:
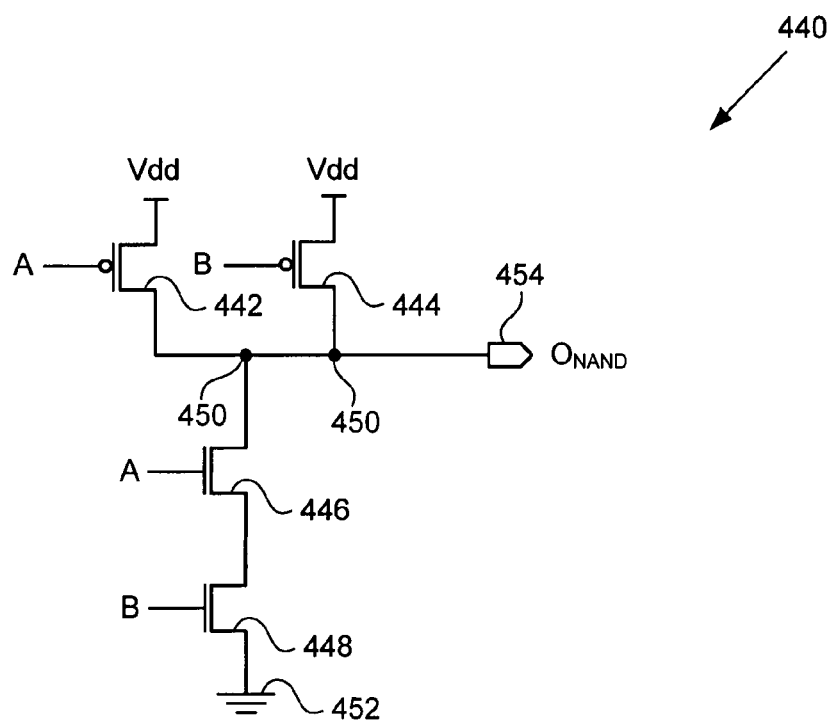
FIGS. 4A and 4B respectively show an implementation of a NAND gate and an implementation of a NOR gate.
Figure 4B:
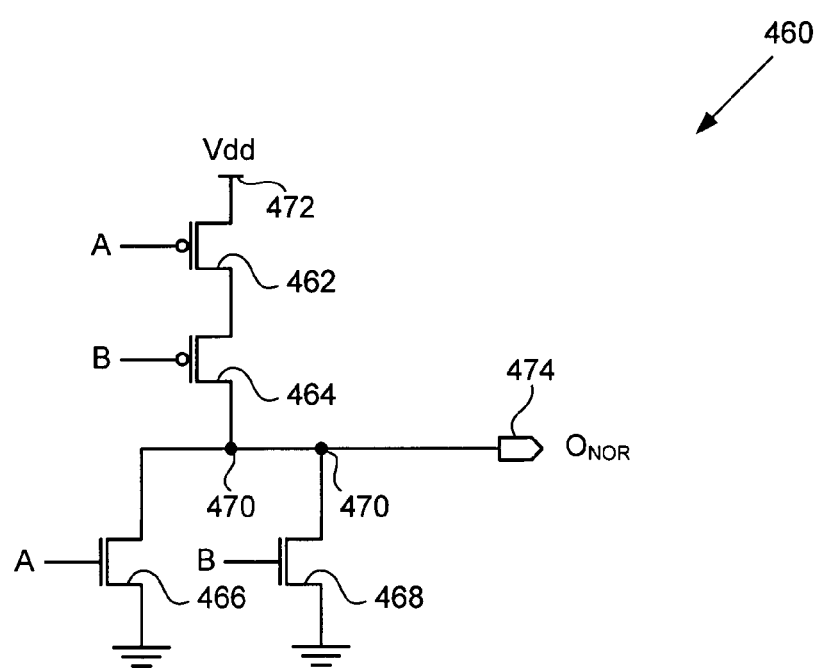

FIGS. 4A and 4B illustrate the higher speed performance of a NAND gate as compared to a NOR gate. FIG. 4A shows a NAND gate implemented with NFET and PFET transistors, and FIG. 4B shows a NOR gate implemented with NFET and PFET transistors.

As shown in FIG. 4A, NAND gate 440 includes PFET transistors 442 and 444 and NFET transistors 446 and 448. Input "A" is provided to the gate of PFET transistor 442 and the gate of NFET transistor 446, while input "B" is provided to the gate of PFET transistor 444 and the gate of NFET transistor 448. Thus, as shown in FIG. 4A, the critical delay path of NAND gate 440 extends between node 450 and ground 452, and includes series coupled NFET transistors 446 and 448. For example, when inputs A and B are both logic "1," node 450 can be quickly connected to ground 452 through series coupled NFET transistors 446 and 448 to output a logic "0" at output ("$O_{NAND}$") 454.

As shown in FIG. 4B, NOR gate 460 includes PFET transistors 462 and 464 and NFET transistors 466 and 468. As shown in FIG. 4B, input "A" is provided to the gate of PFET transistor 462 and the gate of NFET transistor 466, while input "B" is provided to the gate of PFET transistor 464 and the gate of NFET transistor 468. Thus, as shown in FIG. 4B, the critical delay path of NOR gate 460 extends between Vdd 472 and node 470, and includes series coupled PFET transistors 462 and 464. For example, when inputs A and B are both logic "0," node 470 must be coupled to Vdd 472, which can be a DC voltage, through two series coupled PFET transistors (i.e., PFET transistors 462 and 464) to output a logic "1" at output ("$O_{NOR}$") 474. Since an NFET transistor operates approximately 2.5 to 3.0 times faster than a PFET transistor, the critical delay path in NAND gate 440 has a much lower data propagation delay than the critical delay path in NOR gate 460. Thus, as illustrated by FIGS. 4A and 4B, a NAND gate performs much faster than a NOR gate of equal size.

Referring back to FIG. 2, combinational logic 208 is configured to receive each intermediate data output of the intermediate multiplexers, such as intermediate multiplexers 202, 204, and 206, in multiplexer 200. In the embodiment shown in FIG. 2, combinational logic 208 is configured to function as an equivalent of an eight-input OR gate, but at a much higher speed. As such, combinational logic 208 can perform an OR operation on the eight intermediate data outputs and can provide a final output at data output ("O") 231, where final data output 231 corresponds to final data output 131 in FIG. 1.

Figure 5:
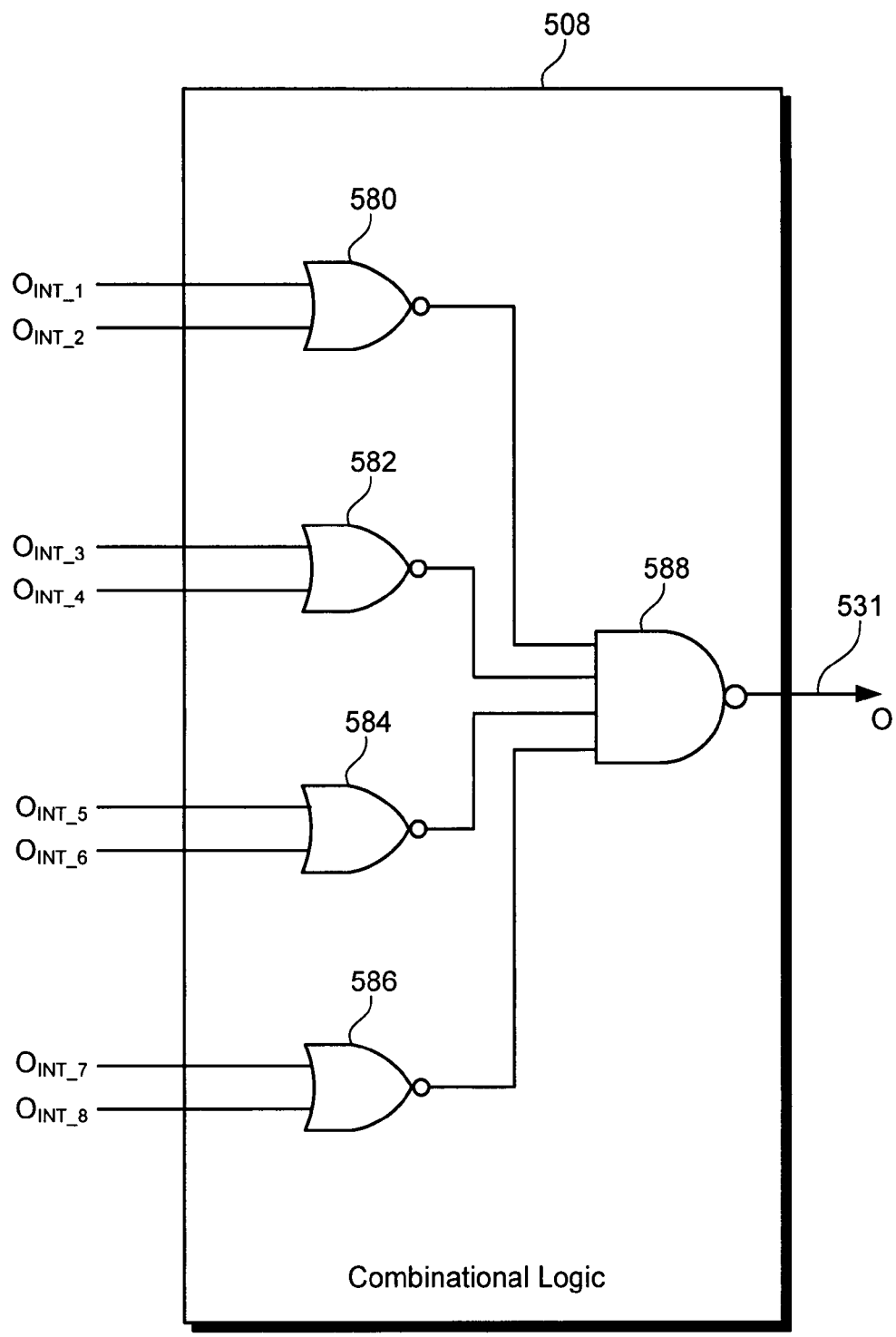
FIG. 5 shows an exemplary implementation of a combinational logic used in the block diagram of FIG. 2, in accordance with one embodiment of the invention.

An exemplary implementation of combinational logic 208 in multiplexer 200 is now discussed with reference to FIG. 5. FIG. 5 shows combinational logic 508, which includes NOR gates 580, 582, 584, and 586, which are two-input NOR gates, NAND gate 588, which is a four-input NAND gate, and final data output ("O") 531. Thus, combinational logic 508 and final data output 531 in FIG. 5 correspond to combinational logic 208 and final data output 231 in FIG. 2, respectively.

As shown in FIG. 5, and with reference to FIG. 2, each NOR gate in combinational logic 508 is configured to receive two of the eight intermediate data outputs in multiplexer 200. For example, NOR gate 580 is configured to receive the two intermediate data outputs of intermediate multiplexers 202 and 204, referred to as $O_{INT\_1}$ and $O_{INT\_2}$, respectively. As further shown in FIG. 5, the output of each NOR gate in combinational logic 508 is provided to an input of NAND gate 588, which in turn generates final data output 531.

As discussed above, only one of the 32 hot code select inputs (i.e., select inputs $S_0$ through $S_{31}$) of multiplexer 200 can be valid at a given time. Therefore, the intermediate data outputs of all but one of the intermediate multiplexers would be a logic "0." The intermediate data output of only one of the intermediate multiplexers would be a valid output, which can be either a logic "1" or a logic "0." Thus, combinational logic 508 can advantageously perform a high speed OR operation on the eight intermediate data outputs, i.e., on $O_{INT\_1}$ through $O_{INT\_8}$, by outputting a logic "0" at final data output 531 if all the intermediate data outputs (include the valid output) are a logic "0"; and a logic "1" if the valid intermediate data output is a logic "1."

It is appreciated that combinational logic 508 can perform the equivalent of an OR operation at a substantially higher speed than a "wide" OR gate, such as an eight-input OR gate. More specifically, since the critical delay path in combinational logic 508 from any of the NOR gate inputs to final data output 531 includes a two-input NOR gate (e.g., NOR gate 580) and a four-input NAND gate (i.e., NAND gate 588), the critical delay path in combinational logic 508 advantageously avoids large numbers of series coupled PFET transistors, thereby reducing a propagation delay in combinational logic 508. For example, an eight-input OR gate is typically implemented using an eight-input NOR gate followed by an inverter, thus forming a critical delay path including at least eight series coupled PFET transistors and an inverter. However, a critical delay path including a two-input NOR gate and a four-input NAND gate includes only two series coupled PFET transistors followed by four series coupled NFET transistors, where each NFET transistor advantageously operates at approximately 2.5 to 3.0 times the speed of a PFET transistor. As a result, the critical delay path of combinational logic 508 substantially reduces the propagation delay in combinational logic 508, thus further reducing the overall propagation delay in multiplexer 200.

One embodiment of the present invention, as shown in FIG. 2, achieves a 32-to-1 multiplexer having 32 data inputs (i.e., data inputs $I_0$ to $I_{31}$) and a final data output (i.e., final data output 231) where, in this embodiment, a critical delay path from any one of the 32 data inputs to the final data output includes a two-input NAND gate, a four-input NAND gate, a two-input NOR gate, and a four-input NAND gate. For example, referring to FIGS. 3 and 5, the critical delay path from data input $I_0$ in FIG. 3 to final data output 531 in FIG. 5 includes two-input NAND gate 320, four-input NAND gate 328, two-input NOR gate 580, and four-input NAND gate 588. The significantly reduced propagation delay provided by this critical delay path enables this embodiment of the invention's multiplexer to operate approximately 50% faster than conventional 32-to-1 multiplexers. It should be understood that in other embodiments, the sizes of the NAND gates used in the intermediate multiplexers and the size of the gates used in combinational logic 508 can be varied to achieve a multiplexer that is larger or smaller than a 32-to-1 multiplexer without departing from the scope of the invention. Moreover, the number of intermediate multiplexers can also be varied without departing from the scope of the invention. For example, in one embodiment, multiplexer 200 in FIG. 2 might be configured to include only 6 intermediate multiplexers to achieve a 24-to-1 high speed multiplexer.

Thus, in one embodiment, the present invention achieves a high speed 32-to-1 multiplexer that can operate approximately 50% faster than conventional 32-to-1 multiplexers. The high speed multiplexer of the invention can be advantageously utilized in high speed applications, such as in a Scoreboard unit used for managing data flow and data dependencies in a complex CPU. Furthermore, since the high speed multiplexer of the invention can be implemented using standard CMOS transistors and gates, such as NAND and NOR gates, the present invention provides a substantial cost savings by avoiding the use of costly low threshold voltage ("low $V_T$") transistors and gates. In any event, if a low $V_T$ process is readily available, the various embodiments of the invention's high speed multiplexer can be used in the low $V_T$ process to further enhance the speed and to operate faster than conventional multiplexers in the same low $V_T$ process. Moreover, the present invention provides substantial flexibility since the various embodiments of high speed multiplexers of the invention can be configured to have greater or fewer than 32 data inputs.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a high speed multiplexer has been described.

The invention claimed is:

1. A high speed multiplexer comprising:
   a plurality of data inputs;
   a plurality of hot code select inputs, wherein only one of said plurality of hot code select inputs is valid, wherein said plurality of hot code select inputs are respectively associated with said plurality of data inputs;
   a plurality of intermediate multiplexers not sharing any of said plurality of hot code select inputs, wherein each of said plurality of intermediate multiplexers not associated with a valid hot code select input is forced to output logic "0";
a final data output;
a critical delay path from any of said plurality of data inputs to said final data output, said critical delay path including a sequence of a first NAND gate, a second NAND gate, a NOR gate, and a third NAND gate to reduce a data propagation delay in said high speed multiplexer.

2. The high speed multiplexer of claim 1 further comprising a decoder configured to generate said plurality of hot code select inputs.

3. The high speed multiplexer of claim 1 wherein said multiplexer is a 32-to-1 multiplexer.

4. The high speed multiplexer of claim 3 wherein said first NAND gate is a two-input NAND gate, said second NAND gate is a four-input NAND gate, said NOR gate is a two-input NOR gate, and said third NAND gate is a four-input NAND gate.

5. The high speed multiplexer of claim 1 wherein said first NAND gate is a two-input NAND gate, said second NAND gate is a four-input NAND gate, and said NOR gate is a two-input NOR gate.

6. The high speed multiplexer of claim 1 wherein said plurality of intermediate multiplexers comprises at least one four-to-one intermediate multiplexer receiving four hot code select inputs from said plurality of hot code select inputs.

7. The high speed multiplexer of claim 1 wherein said multiplexer comprises eight four-to-one intermediate multiplexers, wherein each of said intermediate multiplexers has a critical delay path comprising a first NAND gate and a second NAND gate.

8. The high speed multiplexer of claim 1 wherein said multiplexer is utilized in a Scoreboard unit of a CPU.

9. A high speed multiplexer comprising:
a plurality of intermediate multiplexers receiving data inputs and hot code select inputs and providing intermediate data outputs, said hot code select inputs being respectively associated with said data inputs;
a combinational logic receiving said intermediate data outputs to generate a final data output;
wherein said combinational logic is capable of performing an equivalent of an OR operation at a substantially higher speed than an OR gate with a same number of inputs;
wherein each of said plurality of intermediate multiplexers does not share any of said plurality of hot code select inputs;
each of said plurality of intermediate multiplexers having a critical delay path from any of said data inputs to a corresponding intermediate data output, said critical delay path comprising a first NAND gate and a second NAND gate to reduce a data propagation delay in said high speed multiplexer.

10. The high speed multiplexer of claim 9 wherein said combinational logic is configured to perform a high speed OR operation.

11. The high speed multiplexer of claim 9 wherein said multiplexer is a 32-to-1 multiplexer.

12. The high speed multiplexer of claim 11 wherein said first NAND gate is a two-input NAND gate and said second NAND gate is a four-input NAND gate.

13. The high speed multiplexer of claim 9 wherein said first NAND gate is a two-input NAND gate and said second NAND gate is a four-input NAND gate.

14. The high speed multiplexer of claim 9 wherein said multiplexer is utilized in a Scoreboard unit of a CPU.

15. A high speed multiplexer comprising:
a plurality of data inputs;
a plurality of hot code select inputs, said plurality of hot code select inputs being respectively associated with said plurality of data inputs;
a plurality of intermediate multiplexers not sharing any of said plurality of hot code select inputs, wherein each of said plurality of intermediate multiplexers not associated with a valid hot code select input is forced to output logic "0";
a final data output;
a critical delay path from any of said plurality of data inputs to said final data output, said critical delay path comprising only NAND and NOR gates configured to reduce a data propagation delay in said high speed multiplexer.

16. The high speed multiplexer of claim 15 wherein only one of said plurality of hot code select inputs is valid.

17. The high speed multiplexer of claim 15 wherein said critical delay path comprises a first NAND gate, a second NAND gate, a NOR gate, and a third NAND gate configured to reduce said data propagation delay in said high speed multiplexer.

18. The high speed multiplexer of claim 15 wherein said intermediate multiplexers comprise at least one four-to-one intermediate multiplexer.

19. The high speed multiplexer of claim 15 wherein said high speed multiplexer is utilized in a CPU.

\* \* \* \* \*